US006265868B1

(12) United States Patent
Richter

(10) Patent No.: US 6,265,868 B1
(45) Date of Patent: Jul. 24, 2001

(54) SYSTEM AND METHOD FOR MEASURING TOTAL TRACK WIDTH OF A TEST TRACK IN MAGNETIC MEDIA

(75) Inventor: Hans Jürgen Richter, Santa Clara, CA (US)

(73) Assignee: Seagate Technology LLC, Scotts Valley, CA (US)

( * ) Notice: Subject to any disclaimer, the term of this patent is extended or adjusted under 35 U.S.C. 154(b) by 0 days.

(21) Appl. No.: 09/158,683

(22) Filed: Sep. 22, 1998

Related U.S. Application Data

(60) Provisional application No. 60/069,204, filed on Dec. 11, 1997.

(51) Int. Cl.[7] ............................................. G01R 33/12
(52) U.S. Cl. ................................................ 324/212; 360/31
(58) Field of Search ................................... 324/212, 210; 360/75, 25, 39, 13, 31, 64, 66

(56) References Cited

U.S. PATENT DOCUMENTS

| | | |
|---|---|---|
| 4,644,421 | 2/1987 | Miwa et al. . |
| 5,388,007 | 2/1995 | Sekimoto . |
| 5,479,696 | 1/1996 | McNeil . |
| 5,691,862 | 11/1997 | Hashimoto . |
| 5,889,630 | 3/1999 | Karube et al. . |
| 5,998,994 | 12/1999 | Mori . |
| 6,006,614 | 12/1999 | Guzik et al. . |

OTHER PUBLICATIONS

Lin, T. et al., "Effects of Current and Frequency on Write Read, and Erase Widths for Thin–Film Inductive and Magnetoresistive Heads," *IEEE Transactions on Magnetics*, vol. 25, No. 1, pp. 710–715 (Jan. 1989).

Thompson, D. et al., "The Role of Perpendicular Recording in the Future of Hard Disk Storage," *Journal of The Magnetics Society of Japan*, vol. 21, Supplement, No. S2, pp. 9–15 (1997).

Mingjyue Huang, Derek Yeo and Tuan Tran—"Effects of the Increase of Side Erase Band Width on Off–Track Capability of High Frequency Magnetic Recording", *IEEE Transactions on Magnetics*, vol. 32, No. 5, Sep. 1996, p. 3294–3296.

Tsann Lin, Jodie A. Christner, Terry B. Mitchell, Jing–Sheng Gau and Peter K. George—"Effects of Current and Frequency on Write, Read, and Erase Widths for Thin–Film Inductive and Magnetoresistive Heads", *IEEE Transactions on Magnetics*, vol. 25, No. 1, Jan. 1989—pp. 710–715.

J. K. Lee and P. I. Bonyhard, "A Track Density Model for Magnetoresistive Heads Considering Erase Bands," *IEEE Transactions on Magnetics*, vol. 26, No. 5, Sep. 1990, pp. 2475–2477.

*Primary Examiner*—Jay Patidar
(74) *Attorney, Agent, or Firm*—Merchant & Gould P.C.

(57) ABSTRACT

A method for measuring the total track width of a test track and adjacent erase bands written over an erased area of magnetic media is disclosed. The test track has a known test track center and effective track width, and contains a periodic signal having a known maximum signal strength. An erase is performed at a certain position from the test track center, followed by a reading of the remaining signal strength of the test track, measured at the test track center. The remaining signal strength is stored as a data value as a function of the position of the erase. The erase, reading, and data value storage steps are repeated at various positions from the test track center, each position being successively closer to the test track center. When the remaining signal strength is less than 50% of the maximum signal strength, the test track is rewritten. The erase, reading, and data value storage steps are repeated at various positions from the test track center, this time on the opposite side of the test track. When the remaining signal strength is less than 50% of the maximum signal strength, the erase process may be terminated. From the stored data values, two additional data values are derived which represent the test track right and left boundary locations. The distance between the test track right and left boundary locations represents the total track width.

17 Claims, 5 Drawing Sheets

SYSTEM AND METHOD FOR MEASURING TOTAL TRACK WIDTH OF A TEST TRACK IN MAGNETIC MEDIA

CROSS-REFERENCE TO RELATED APPLICATIONS

Embodiments of this invention relate to Provisional Application Serial No. 60/069,204, filed Dec. 11, 1997. The contents of that application are incorporated by reference herein.

BACKGROUND OF THE INVENTION

1. Field of the Invention

Embodiments of this invention relate generally to tracks on magnetic media of the type generally used for storing digital data, and in particular embodiments to methods for measuring the total width of tracks on magnetic media, and systems incorporating the same.

2. Description of Related Art

Disk drives typically contain at least one magnetic disk that rotates relative to one or more read/write head assemblies. There is typically one read/write head assembly for each disk surface. The read/write head assemblies magnetize areas on the disk during writing and sense the magnetization of areas on the disk during reading. Conventional read/write head assemblies include a coil wrapped about a C-shaped core, the ends of the core forming two magnetic poles separated by a gap. When writing information onto a disk, current flow in the coil causes magnetic flux to flow in the core and fringe across the gap. Part of the magnetic flux flows into a portion of the disk located under the gap and magnetizes that portion of the disk in a direction parallel to the magnetic flux lines. If the direction of current flow is subsequently reversed, the direction of magnetic flux is also reversed, and areas of the disk will be magnetized in the opposite direction.

When the read/write head assembly is configured to read information from the disk, the magnetized portions of the disk passing under the gap induce a voltage across the coil. The polarity of the induced voltage is dependent on the orientation of the magnetized portion of the disk. As magnetized portions of the disk pass under the gap, the induced voltages are sensed and converted into data.

Information is stored within tracks on the disk, where each track has a width that is approximately equivalent to the width of the read/write head. Typically, such tracks define a pattern of concentric ring-shaped or spiral areas of disk recording surfaces. However, when writing data to or reading data from a particular track location, adjacent track portions (hereinafter referred to as tracks, for convenience) may corrupt the reading or writing process. When writing data onto a track, read/write heads will influence an area of the disk wider than the width of the head due to magnetic field effects at the edges of the read/write head (edge effects). Data on adjacent tracks may therefore be inadvertently corrupted due to these edge effects. When reading information from a track, read/write heads may inadvertently read data from adjacent tracks, generating noise and false data transitions. These effects may be intensified if the head is not properly aligned over the center of the track.

Erase bands can be beneficial for off-track performance (when the head is not properly aligned over the center of the track). Erase bands are areas of randomized magnetic moments located on either side of a track, and do not carry any recorded information. Erase bands are typically created simultaneously with writing data onto a disk. During the writing process, in addition to writing a track containing readable data, the read/write head erases any information on the sides of the track by causing the magnetic moments in the bands adjacent to the track to be randomized. No special or separate head is needed to create these erase bands, as the randomized magnetic moments are a product of the edge effects of the read/write head. The width of the track containing readable data is identified as the effective track width (ETW). The combined width of the readable track and the two adjacent erase bands is identified as the total track width (TTW).

During reading, the lack of a signal from the erase bands will allow the read/write head to move off-center with respect to the test track to a certain degree without the read operation being corrupted by the data of adjacent tracks. The degree to which a read/write head can move off-center of the track and still read data accurately is known as off-track capability. The bit error rate (BER) of data read by the read/write head while off-track is one method of measuring off-track performance.

Theoretically, wide tracks separated by wide erase bands will maximize off-track performance. However, given the finite storage area available on magnetic media such as hard disks, increasing the erase band width (EBW) will decrease track density (the number of tracks per unit length) and the overall data storage capability of the disk. High track density can be maintained by narrowing the ETW, but as ETW decreases, the output signal during readback will also be reduced. As the output signal is reduced, the signal-to-noise ratio (SNR) will decrease as noise from other sources such as the channel electronics and the head becomes larger with respect to the output signal, eventually reaching a level sufficient to corrupt the signal being read. Thus, the tradeoffs between track density, ETW, off-track performance, and BER establish a practical upper limit to EBW.

Another factor affecting EBW is the linear density (the number of flux reversals per unit length) of the recorded disk. Data storage capability can be increased by writing more information (more flux reversals) in a given length of track, thereby increasing the linear density. However, as information is written with increased linear density, the EBW of the simultaneously created erase bands increases. Thus, maximizing data storage capability can be a complex process involving tradeoffs between the competing parameters of linear density, track density, EBW, ETW, TTW, off-track performance, and BER. Measurement of EBW, ETW, and TTW is therefore an important task in the research and development of magnetic media products.

Several methods are currently used to measure EBW, ETW, and TTW. One method is disclosed in the article "Effects of the Increase of Side Erase Band Width on Off-Track Capability of High Frequency Magnetic Recording" by Huang, Yeo, and Tran in IEEE Transactions on Magnetics, Vol. 32, No. 5, September 1996. In that method, the magnetic media is DC-erased, two reference tracks are written at the same linear density, and a desired track is written over the two background reference tracks, also at the same linear density. A track scan is then performed (moving a read head radially across a track) in which a narrow-band overwrite filter is used to measure the narrow band read back signal. As the read head moves across the track, it encounters a narrow reference track, a narrow erase band, a wide desired track, a narrow erase band, and a narrow reference track, successively. The resultant signal profile as a function of the read head position is then computer-extrapolated, and after some calculations the EBW, ETW, and TTW can be approximated. A disadvantage of this method is that the calculations rely on indirectly locating the boundaries between the reference tracks, erase bands, and the desired track by identifying sharp and distinct transitions in the signal profile. In reality, however, the recorded signal profile does not exhibit distinct transitions. Without distinct transitions, the boundaries between reference tracks, erase bands, and the desired track cannot be precisely located, and thus inaccuracies are introduced.

SUMMARY OF THE DISCLOSURE

Therefore, it is an object of embodiments of the invention to provide a system and method for measuring TTW by incrementally DC-erasing a test track and erase bands from one side and recording a signal profile until more than 50% of the test track signal is eliminated, repeating the process for the other side, and computing an approximate TTW from the locations at which approximately 50% of the test track signal was eliminated, wherein the computation involves deriving line equations from the substantially linear signal profiles and does not rely on the identification of sharp and distinct transitions in the signal profiles.

These and other objects are accomplished with methods for measuring TTW according to embodiments of the present invention, wherein the test track contains a test signal and has a known test track center and maximum signal strength. An erase is repeatedly performed at various positions right of the test track center, each position being successively closer to the test track center. For each position, an erase-right data value representing the remaining signal strength at the test track center is measured and stored as a function of the position of the erase. When the remaining signal strength is less than the maximum signal strength by a specified amount, the test track is re-written at substantially the same position as originally written, and an erase is again repeatedly performed at various positions left of the test track center, each position being successively closer to the test track center. For each position, an erase-left data value representing the remaining signal strength at the test track center is measured and stored as a function of the position of the erase. When the remaining signal strength is less than the maximum signal strength by a specified amount, the erase process is terminated. The erase-right and erase-left data values are then processed to compute the total track width.

These and other objects, features, and advantages of embodiments of the invention will be apparent to those skilled in the art from the following detailed description of embodiments of the invention, when read with the drawings and appended claims.

DETAILED DESCRIPTION OF PREFERRED EMBODIMENTS

In the following description of preferred embodiments, reference is made to the accompanying drawings which form a part hereof, and in which is shown by way of illustration specific embodiments in which the invention may be practiced. It is to be understood that other embodiments may be utilized and structural changes may be made without departing from the scope of the preferred embodiments of the present invention. For example, although the description and drawings reference a disk drive, it is understood that embodiments of the present invention may be used with magnetizable media other than disks (e.g. tapes and cylinders).

A disk drive stores information within a generally concentric ring or spiral-shaped track pattern on the disk. Each track contains a series of magnetizable areas whose orientation of magnetic moments may be changed. To maximize track density (the number of tracks per unit radial length) and overall data storage capability of a disk, tracks are placed concentrically and in close proximity to each other, or in embodiments utilizing spiral tracks, tracks spiral inward in close proximity to each other. However, the close proximity of adjacent tracks can cause problems during reading and writing. During writing, edge effects cause the read/write head to magnetize an area of the disk wider than the width of the head, and adjacent tracks may be inadvertently overwritten. Adjacent tracks can also generate noise and false data transitions when data from a selected track is being read back. These effects may be intensified if the read/write head is not properly aligned over the center of the track.

Erase bands can be beneficial for off-track performance (when the head is not properly aligned over the center of the track). Erase bands are areas of randomized magnetic moments located on either side of a track, and do not carry any recorded information. Erase bands are typically created simultaneously with writing data onto a disk. During writing, in addition to writing data onto the desired track, the read/write head assembly erases any information on the sides of the track by causing the magnetic moments in the bands adjacent to the track to be randomized. No special or separate head is needed to create erase bands, as the randomized magnetic moments are a product of the edge effects of the read/write head.

However, erase bands typically should not be made arbitrarily wide. Maximizing data storage capability is a complex process involving tradeoffs between the competing parameters of linear density, track density, EBW, ETW, TTW, off-track performance, and BER. Measurement of TTW is therefore an important task in the research and development of magnetic media products.

Figure 1:
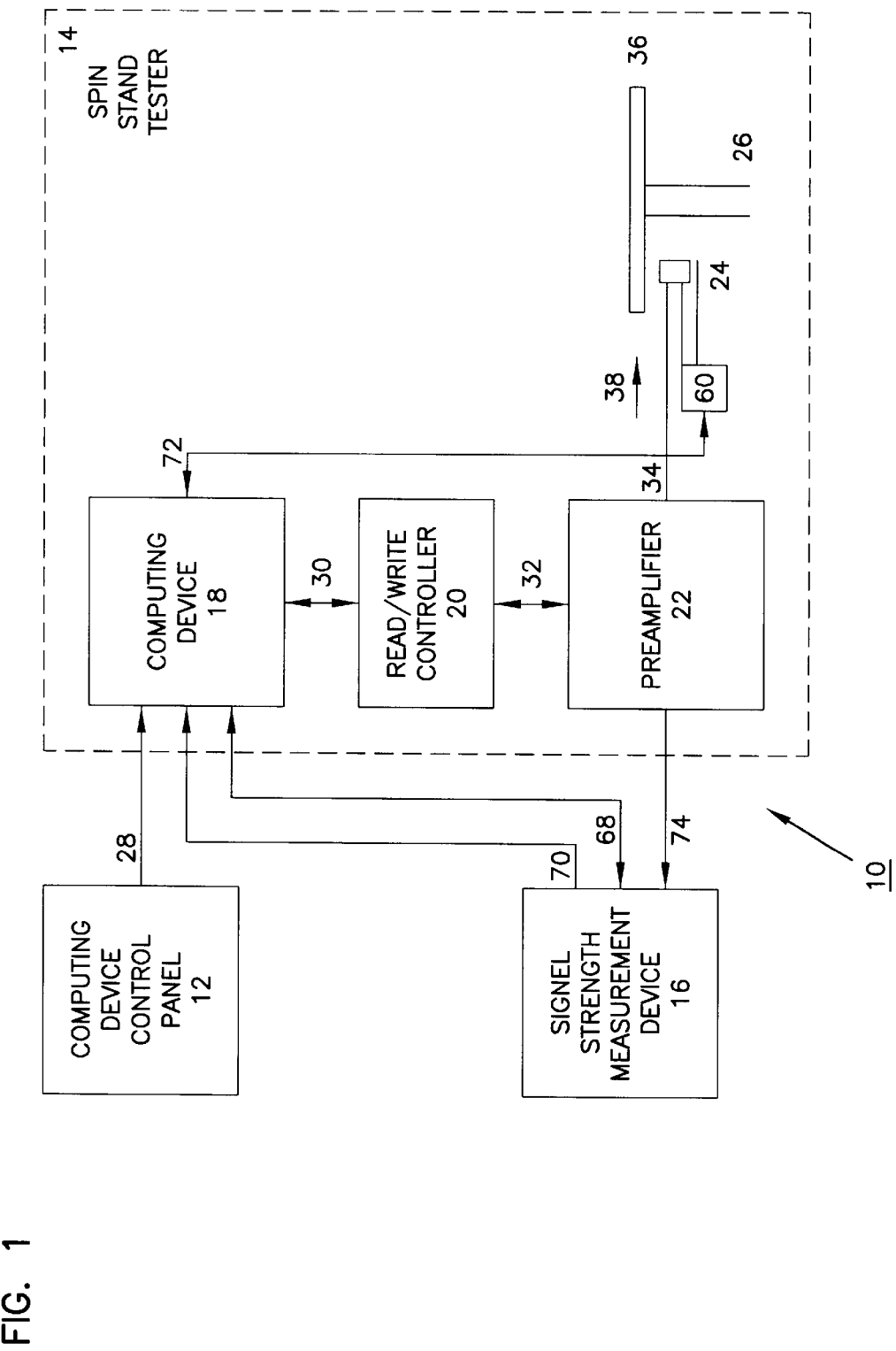
FIG. 1 is a schematic diagram of a TTW measurement system according to an embodiment of the invention.

FIG. 1 illustrates an example of a TTW measurement system 10 for use in measuring TTW in accordance with an embodiment of the invention. The TTW measurement system 10 comprises a computing device control panel 12, a spin stand tester 14, and a signal strength measurement device 16. The spin stand tester 14 comprises a computing device 18, a read/write controller 20, a preamplifier 22, a read/write head assembly 24, a head positioner 60 coupled to the read/write head assembly 24, a spindle 26, and a disk 36 coupled to the spindle 26. In alternative embodiments of the present invention, the signal strength measurement device 16 may be located within the read/write controller 20 or the computing device 18.

An operator (not shown in FIG. 1) controls the TTW measurement system 10 by entering commands into the computing device control panel 12, which communicates with the spin stand tester 14 through computing device control signals 28. Responsive to the computing device control signals 28, the computing device 18 communicates with the read/write controller 20 through read/write control signals 30, communicates with the head positioner 60 through head positioner control signals 72, and communicates with the signal strength measurement device 16 through signal strength measurement device control signals 68. Responsive to the read/write control signals 30, the read/write controller 20 communicates with the preamplifier 22 through preamplifier control signals 32. Responsive to the preamplifier control signals 32, the preamplifier may source write current 38 to the read/write head assembly 24 through conductors 34, sense voltages from the read/write head assembly 24 across the conductors 34, or communicate with the signal strength measurement device 16 through test signal information 74. Responsive to the head positioner control signals 72, the head positioner 60 may move the read/write head assembly 24 radially with respect to the disk 36. Responsive to signal strength measurement device control signals 68, the signal strength measurement device 16 may communicate data to the computing device 18 through signal strength measurement device data signals 70.

Figure 6:
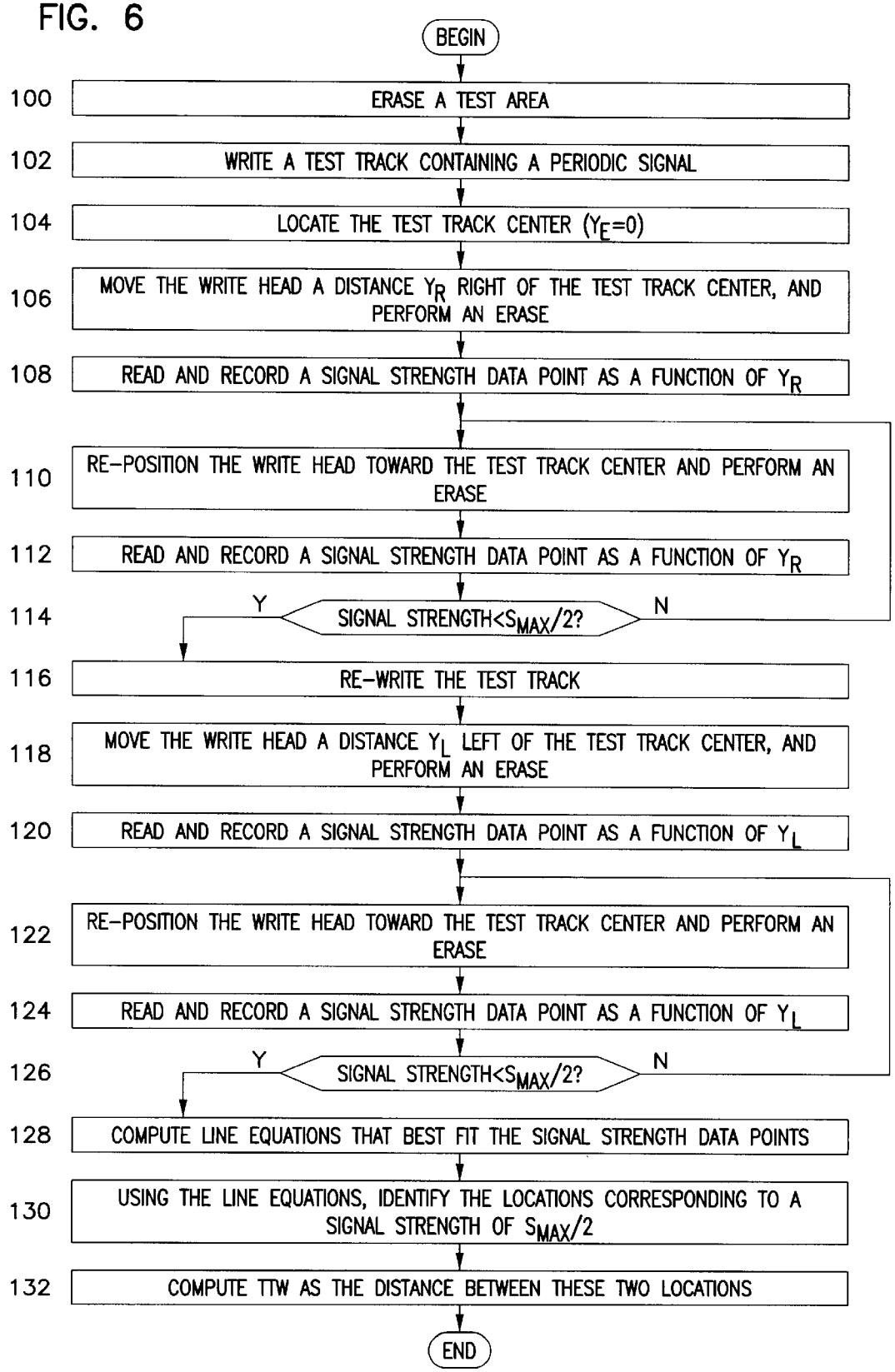
FIG. 6 contains a flowchart of a process for measuring TTW according to an embodiment of the invention.

To measure TTW, an operator uses the computing device control panel 12 to initiate a program stored in computing device 18. In alternative embodiments of the invention, the program may be stored in hardware, software, or firmware of the computing device 18 or a peripheral (not shown in FIG. 1). The program controls the system to carry out a TTW measuring process. An example of such a process according to an embodiment of the present invention is represented by the flowchart of FIG. 6. In general, the process of FIG. 6 involves the steps of: (1) writing a test track and locating the test track center and maximum signal strength at the test track center; (2) repeatedly and incrementally erasing a portion of the test track at decreasing distances to the right of the test track center, and recording the remaining signal strength at the test track center after each erase until the remaining signal strength is less than 50% of the maximum signal strength; (3) rewriting the test track; (4) repeatedly and incrementally erasing a portion of the test track at decreasing distances to the left of the test track center, and recording the remaining signal strength at the test track center after each erase until the remaining signal strength is less than 50% of the maximum signal strength; (5) determining from the recorded signal strength data points the approximate locations to the left and right of the test track center at which the remaining signal strength was approximately 50% of the maximum signal strength; and (6) computing TTW by determining the distance between the locations at which the remaining signal strength was approximately 50% of the maximum signal strength.

Figure 2:
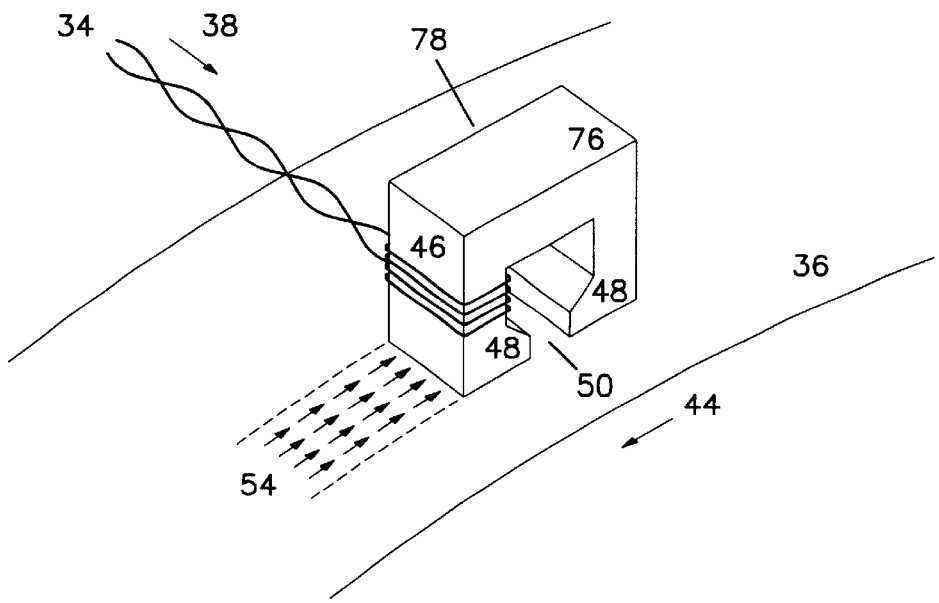
FIG. 2 is a diagram showing the erasing of a test area on magnetic media according to an embodiment of the invention.

As illustrated in FIG. 2 and described in step 100 of FIG. 6, in an embodiment of the invention the program first causes an erase to be performed such that all magnetic moments in the test area of the disk 36 are oriented in the same direction. To accomplish this, in one embodiment of the present invention the preamplifier 22 (see FIG. 1), under program control, sources a constant write current 38 through a plurality of conductors 34 and into a write head 78, which forms a part of the read/write head assembly 24. The write head 78 includes a core 76 shaped to form poles 48 and a gap 50, and a coil 46 wrapped about the core 76 and coupled to the conductors 34. The constant write current 38 flowing through the coil 46 induces a constant magnetic flux to form in the core 76 and fringe across the gap 50, orienting all magnetic moments under the gap 50 in the same direction and creating a track of erased magnetic moments 54 as the disk 36 spins in the direction indicated by the arrow 44. The program then directs the head positioner 60 (not shown in FIG. 2) to radially reposition the write head 78 over adjacent areas of the disk 36, and the erase process is repeated until a sufficiently wide area of the disk 36 has been erased. In alternative embodiments of the present invention, disk 36 may be erased prior to its mounting in the spin stand tester 14 by an external device such as a large permanent magnet.

Figure 3:
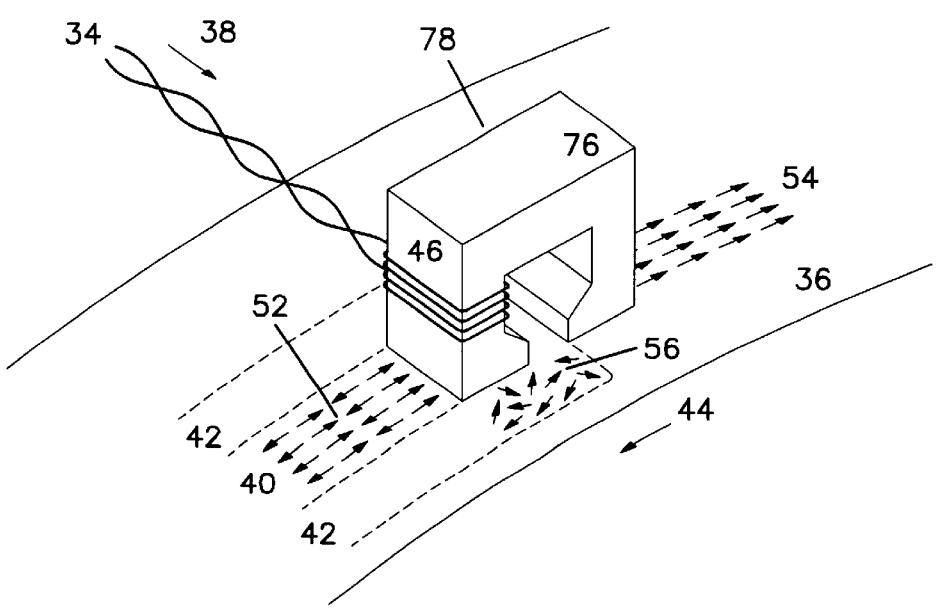
FIG. 3 is a diagram showing the writing of a test track and erase bands according to an embodiment of the invention.

Next, as illustrated in FIG. 3 and described in step 102 of FIG. 6, the program causes the writing of a signal onto a test track 40 and the formation of corresponding erase bands 42 over the erased area of the disk 36. In preferred embodiments of the present invention, the written signal is periodic. The process to accomplish this is very similar to the process for erasing, except that the direction of the write current 38 is periodically reversed. By continually reversing the direction of the write current 38 as the disk 36 spins in the direction indicated by the arrow 44, a pattern of magnetic moments 52 with alternating orientations representing a periodic signal is written onto the test track 40 at a certain linear density, overwriting the homogeneous orientation of erased magnetic moments 54. At the same time that the test track 40 is being written, erase bands 42 are formed along the edges of the test track 40 due to edge effects from the write head 78. Within these erase bands 42, randomized magnetic moments 56 are formed.

Figure 4:
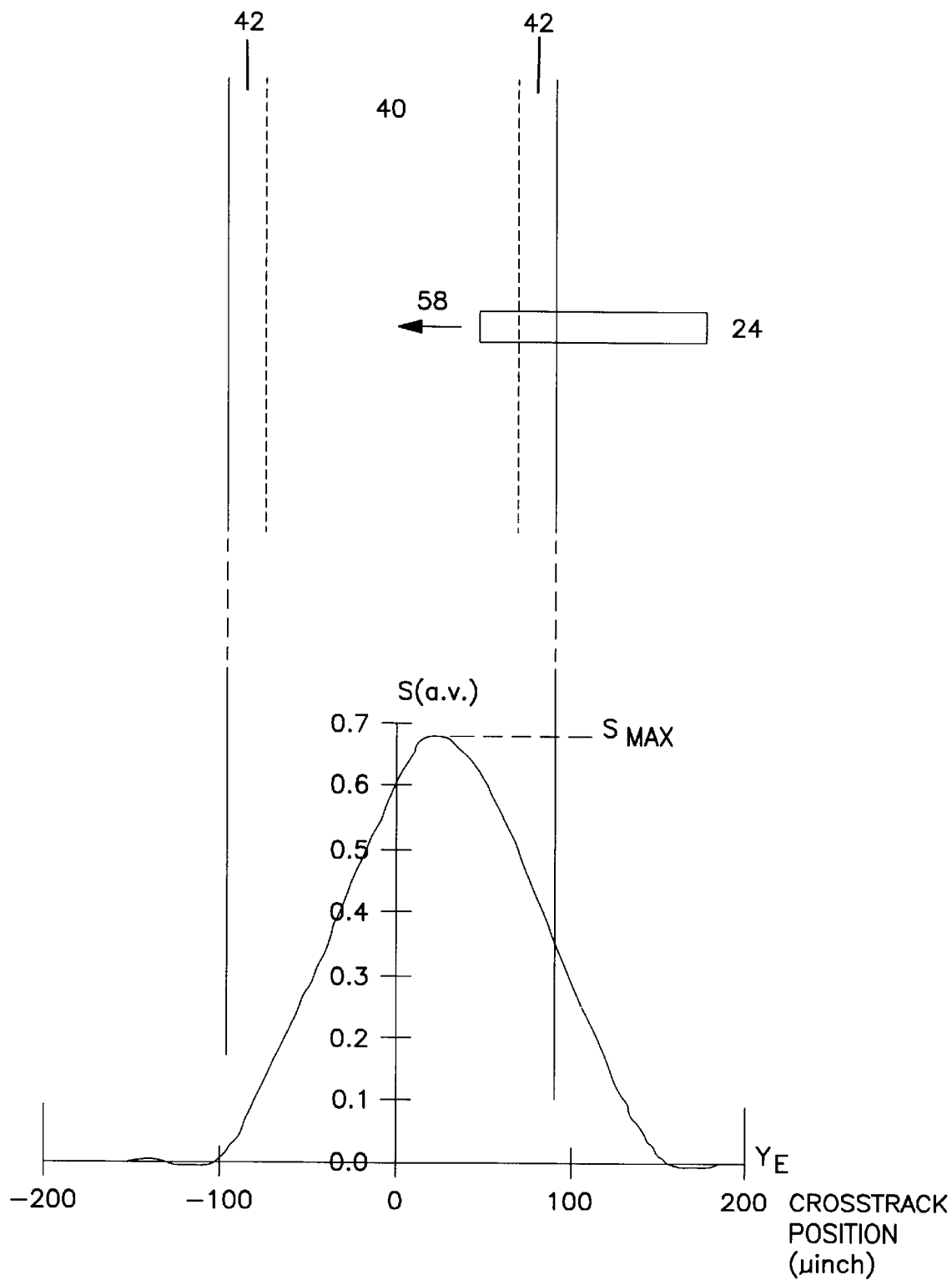
FIG. 4 is a diagram showing a track scan of the test track and erase bands and a corresponding graph of signal strength as a function of crosstrack position according to an embodiment of the invention.

Once the test track 40 is completely written, a track scan is performed to locate the approximate center of the test track 40 (step 104 of FIG. 6). As illustrated in FIG. 4, during the track scan the read/write head assembly 24 is moved radially across the erase bands 42 and test track 40 in the direction of arrow 58 by the head positioner 60 (see FIG. 1) under program control. In preferred embodiments of the invention, the read/write head assembly 24 includes a magneto-resistive (MR) read head coupled to the write head 78. The MR read head is comprised of a conductive element whose resistivity varies as a function of an applied magnetic field. In an MR head, a constant current is sourced through the element, and as the head is placed in close proximity with magnetized areas on the disk 36, the applied magnetic field from the magnetic moments on the disk 36 causes the resistance of the element, and hence the voltage across it, to change. If the applied magnetic field is oriented in the same direction as the current, the resistance and voltage across the element increases. If the applied magnetic field is oriented in the opposite direction from the current flow, the resistance and voltage across the element decreases. Thus, by sensing the voltage across the element, stored data in the form of oriented magnetic moments can be read. In alternative embodiments of the invention, the write head 78 also serves as the read head. In such embodiments, magnetic fields from the magnetic moments form in the core, and a voltage is induced in the coil 46. Again, by sensing the voltage across the coil 46, stored data in the form of oriented magnetic moments can be read.

Referring again to FIG. 1, when the read/write head assembly 24, under program control, is positioned over an area on the disk 36 by the head positioner 60, the read/write head assembly 24 senses a voltage and communicates this voltage to the preamplifier 22 through conductors 34. The preamplifier 22 transforms the voltage reading into test signal information 74, and communicates the test signal information 74 to the signal strength measurement device 16. In preferred embodiments of the present invention, the signal strength measurement device 16 includes a detector that measures the peak-to-peak voltage amplitude of the test signal information 74 and communicates a signal strength data value for storage in the computing device 18 through signal strength measurement device data signals 70. It should be noted that in alternative embodiments of the present invention, the signal strength measurement device 16 may be a frequency analysis device that performs a Fourier transform or a fast Fourier transform on the test signal information 74 and computes and stores the resultant Fourier spectrum. In such embodiments, the data values comprising the Fourier spectrum are communicated to the computing device 18 through signal strength measurement device data signals 70, and the amplitude of the fundamental frequency of the Fourier spectrum is stored in the computing device 18 as a signal strength data value.

Under program control, this process of reading test signal information 74 and manipulating it to derive a signal strength data value is repeated at multiple positions of the read/write head assembly 24 as the read/write head assembly 24 incrementally traverses the erase bands 42 and test track 40. A collection of stored signal strength data values as a function of location is thereby produced, for example, as represented in FIG. 4, where the crosstrack position $Y_E$ is represented in micro-inches, and the signal strength S is represented in arbitrary units (a.u.). From the collection of stored signal strength data values, the location at which the signal strength is at a maximum ($S_{MAX}$) is determined and then shifted to compensate for the known read/write offset inherent in the read/write head. The location corresponding to maximum signal strength (compensated) is stored as the approximate test track center and is assigned a crosstrack position reference location of $Y_E=0$. In an embodiment of the invention, the ETW can also be determined by computing the distance between the locations of the two stored signal strength data values whose signal strength is approximately 50% of $S_{MAX}$.

Figure 5:
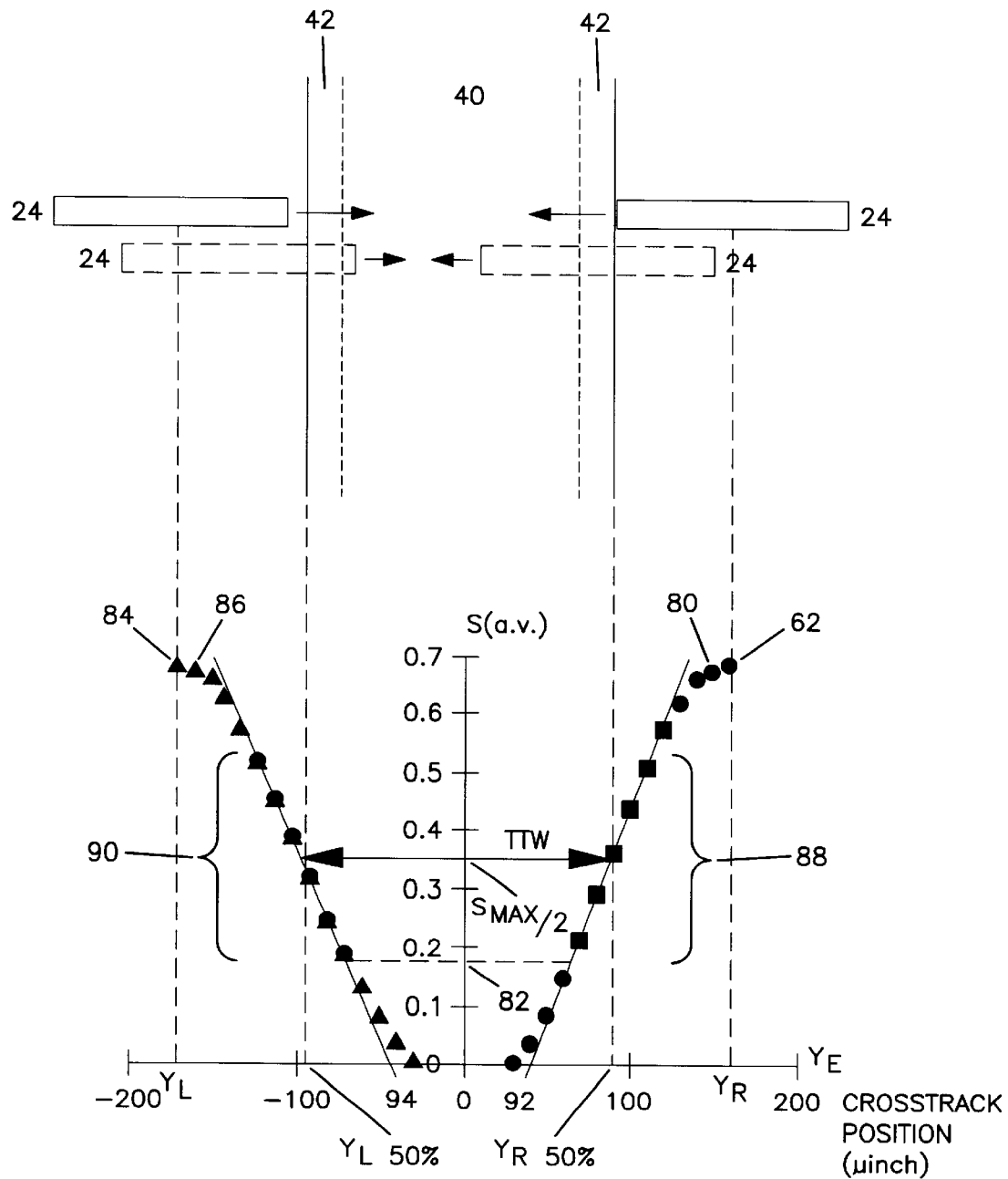
FIG. 5 is a diagram showing an incremental erase of the test track and erase bands from the right and left sides, and a corresponding graph of remaining signal strength after an erase as a function of the crosstrack position of the erase according to an embodiment of the invention.

As illustrated in FIG. 5 and described in step 106 of FIG. 6, once the track scan has been completed, the read/write head assembly 24 is positioned at a distance $Y_R$ to one side (for example, the right side) of the computed test track center ($Y_E=0$), and an erase is performed as described above. As described generally in step 108 of FIG. 6, the read/write head assembly 24 is then re-positioned at the approximate test track center, and the signal strength is read, computed, and stored as previously described as an erase-right data value 62 as a function of the distance $Y_R$. This erase-right data value 62 represents the signal strength of the remaining test track 40 after an erase is performed over the test track 40 at distance $Y_R$ from the test track center. As described in steps 110–114 of FIG. 6, the read/write head assembly 24 is then re-positioned at a new distance incrementally closer to the computed test track center than the previous $Y_R$, and the signal strength is again read, computed, and stored as another erase-right data value 80 corresponding to the new distance $Y_R$. This process is repeated until the measured remaining signal strength is below $S_{MAX}/2$. The stopping criteria may be a particular signal strength (for example $S_{MAX}/4$ as indicated by reference number 82 in FIG. 5), or it may be based on the storing of a fixed number of erase-right data values with a measured signal strength below $S_{MAX}/2$ (for example, two erase-right data values below $S_{MAX}/2$ as illustrated in FIG. 5). In alternative embodiments of the present invention, the process is repeated until the measured signal strength drops to approximately 0% or any other suitable predefined limit.

Next, the test track is completely re-written in substantially the same location with preferably, but not necessarily, the same periodic signal as described above and in step 116 of FIG. 6, and illustrated in FIG. 3.

As illustrated in FIG. 5 and represented by step 118 of FIG. 6, the read/write head assembly 24 is then positioned at a distance $Y_L$ to the opposite side (for example, the left side) of the computed test track center ($Y_E=0$), and an erase is again performed as described above and illustrated in FIG. 2. As described generally in step 120 of FIG. 6, the read/write head assembly 24 is again re-positioned at the approximate test track center ($Y_E=0$), and the signal strength is read, computed, and stored as previously described as an erase-left data value 84 as a function of the distance $Y_L$. This erase-left data value 84 represents the signal strength of the remaining test track 40 after an erase is performed over the test track 40 at distance $Y_L$ from the test track center. As represented by steps 122–126 of FIG. 6, the read/write head assembly 24 is then repositioned at a new distance incrementally closer to the computed test track center than the previous $Y_L$, and the signal strength is again read, computed, and stored as another erase-left data value 86 corresponding to the new distance $Y_L$. This process is repeated until the measured signal strength is below $S_{MAX}/2$. The stopping criteria may be a particular signal strength (for example $S_{MAX}/4$ as indicated by reference number 82 in FIG. 5), or it may be based on the storing of a fixed number of erase-left data values with a measured remaining signal strength below $S_{MAX}/2$ (for example, three erase-left data values below $S_{MAX}/2$ as illustrated in FIG. 5). In alternative embodiments of the invention, the process is repeated until the measured signal strength drops to approximately 0% or any other suitable limit. Note that although the above discussion indicates the determination of erase-right data values followed by erase-left data values, the order is unimportant.

As described generally in step 128 of FIG. 6, in preferred embodiments of the present invention, once the erase-right data values are stored, a processor within the computing device applies linear regression techniques to those erase-right data values whose signal strength is within a specified amount of 50% of the maximum pre-erase signal strength ($S_{MAX}/2$), indicated as 88 in FIG. 5, and an equation representing the best-fit straight line 92 through those selected erase-right data values is derived. In alternative embodiments of the present invention, curve-fit algorithms are applied to those erase-right data values whose signal strength is within a specified amount of 50% of the maximum pre-erase signal strength ($S_{MAX}/2$), indicated as 88 in FIG. 5, and an equation representing the best-fit curved line through those selected erase-right data values is derived. In preferred embodiments of the invention, the re-positioning of the read/write head assembly 24 is accomplished in steps selected to be small enough so that sufficient erase-right data values are stored to produce a best-fit line equation without needing to repeat the right-side erase procedure. As described generally in step 130 of FIG. 6, from this best-fit line equation the approximate 50% of maximum signal strength value, $S_{MAX}/2$, is used to compute the distance to the right of the test track center at which an erase would reduce the signal strength by approximately 50%, identified as $Y_{R50\%}$ in FIG. 5.

Similarly, as described generally in step 128 of FIG. 6, in preferred embodiments of the present invention, once the erase-left data values are stored, the processor within the computing device applies linear regression techniques to those erase-left data values whose signal strength is within a specified amount of 50% of the maximum pre-erase signal strength ($S_{MAX}/2$), indicated as 90 in FIG. 5, and an equation representing the best-fit straight line 94 through those selected erase-left data values is derived. In alternative embodiments of the present invention, curve-fit algorithms are applied to those erase-left data values whose signal strength is within a specified amount of 50% of the maximum pre-erase signal strength ($S_{MAX}/2$), indicated as 88 in FIG. 5, and an equation representing the best-fit curved line through those selected erase-left data values is derived. In preferred embodiments of the invention, the repositioning of the read/write head assembly 24 is accomplished in steps selected to be small enough so that sufficient erase-left data values are stored to produce a best-fit line equation without needing to repeat the left-side erase procedure. As described generally in step 130 of FIG. 6, from this best-fit line equation the approximate 50% of maximum signal strength value, $S_{MAX}/2$, is used to compute the distance to the left of the test track center at which an erase would reduce the signal strength by approximately 50%, identified as $Y_{L50\%}$ in FIG. 5.

Once these two values are computed, the TTW can be determined by making the computation TTW=$Y_{R50\%}$−$Y_{L50\%}$, as described in step 132 of FIG. 6. In one embodiment of the invention, the EBW can also be determined by making the computation EBW=(TTW−ETW)/2.

In preferred embodiments of the invention, the tester may be, for example, a Guzik 1701 MP RWA 1632, and the magnetic media may be controlled to rotate, for example, at 4200 RPM. In preferred embodiments of the invention, the test track is recorded at 40 kfci using an MR head with a write current of 60 mA p-p and a bias current of 12 mA on a medium suitable for about 1 Gbit/inch recording density.

Therefore, according to the foregoing description, preferred embodiments of the present invention provide a system and method for measuring TTW by incrementally erasing a test track and erase bands from one side and recording a signal profile until more than 50% of the test track signal is eliminated, repeating the process for the other side, and computing an approximate TTW from the locations at which approximately 50% of the test track signal was eliminated, wherein the computation involves deriving line equations from the substantially linear signal profiles and does not rely on the identification of sharp and distinct transitions in the signal profiles.

The foregoing description of preferred embodiments of the invention has been presented for the purposes of illustration and description. It is not intended to be exhaustive or to limit the invention to the precise form disclosed. Many modifications and variations are possible in light of the above teaching. It is intended that the scope of the invention be limited not by this detailed description, but rather by the claims appended hereto.

What is claimed is:

1. A system for measuring total track width of a test track in magnetic media containing a test signal and having a known test track center, the system comprising:

a read/write head for reading test signal information from a plurality of locations across the test track; and means for processing the test signal information to determine the total track width.

2. A method for measuring total track width of a test track in magnetic media containing a test signal and having a known test track center and maximum signal strength, the method comprising:

repeatedly performing an erase at various positions right of the test track center, each position being successively closer to the test track center, and measuring and storing, as an erase-right data value, remaining signal strength at the test track center as a function of the position of the erase, until the remaining signal strength is less than the maximum signal strength by a specified amount;

re-writing the test track at substantially the same position as originally written;

repeatedly performing an erase at various positions left of the test track center, each position being successively closer to the test track center, and measuring and storing, as an erase-left data value, remaining signal strength at the test track center as a function of the position of the erase, until the remaining signal strength is less than the maximum signal strength by a specified amount; and processing the erase-right and erase-left data values to compute the total track width.

3. The method of claim 2, wherein the step of processing the erase-right and erase-left data values to compute the total track width comprises the steps of:

deriving an erase-right line equation representing a best-fit line through those erase-right data values within a specified range of the maximum signal strength;

computing a test track right boundary location from the erase-right line equation by applying a value equivalent to a specified percentage of the maximum signal strength to the erase-right line equation;

deriving an erase-left line equation representing a best-fit line through those erase-left data values within a specified range of the maximum signal strength;

computing a test track left boundary location from the erase-left line equation by applying a value equivalent to a specified percentage of the maximum signal strength to the erase-left line equation; and computing the total track width by determining a distance between the test track right boundary location and the test track left boundary location.

4. The method of claim 3, wherein the specified range is centered at approximately 50% of the maximum signal strength.

5. The method of claim 3, wherein the specified percentage is approximately 50%.

6. The method of claim 2, wherein the steps of measuring and storing, as erase-right and erase-left data values, remaining signal strength at the test track center as a function of the position of the erase further comprise the steps of:

reading test signal information from the test track center; and measuring and storing, as erase-right and erase-left data values, a peak-to-peak voltage amplitude of the test signal information as a function of the position of the erase.

7. The method of claim 2, wherein the steps of measuring and storing, as erase-right and erase-left data values, remaining signal strength at the test track center as a function of the position of the erase further comprise the steps of:

reading test signal information from the test track center;

generating a Fourier spectrum from the test signal information, the Fourier spectrum including a fundamental frequency with a measurable amplitude; and storing, as erase-right and erase-left data values, the amplitude of the fundamental frequency as a function of the position of the erase.

8. The method of claim 3, wherein the steps of deriving erase-right and erase-left line equations representing best-fit lines through those erase-right and erase-left data values within a specified range of the maximum signal strength further comprise the step of:

utilizing linear regression techniques on those erase-right data and erase-left values within a specified range of the maximum signal strength to compute erase-right and erase-left line equations representing straight lines through those erase-right and erase-left data values.

9. The method of claim 3, wherein the steps of deriving erase-right and erase-left line equations representing best-fit lines through those erase-right and erase-left data values within a specified range of the maximum signal strength further comprise the step of:

utilizing curve-fit algorithms on those erase-right and erase-left data values within a specified range of the maximum signal strength to compute erase-right and erase-left line equations representing curved lines through those erase-right and erase-left data values.

10. A system for measuring total track width of a test track in magnetic media having a known test track center and maximum signal strength, the test track having right and left sides, the system comprising:

a read/write head for writing and erasing the test track and reading test signal information from the test track center;

a signal strength measurement device responsive to the test signal information for measuring remaining signal strength from the test signal information; and a computing device in communication with the signal strength measurement device for processing and storing remaining signal strength as a function of the position of the erase;

wherein a right test track boundary is derived from erase-right data values obtained by incrementally erasing the test track from the right side and storing remaining signal strength as a function of the position of the erase, a left test track boundary is derived from erase-left data values obtained by incrementally erasing the test track from the left side and storing remaining signal strength as a function of the position of the erase; and wherein the total track width is computed as a distance between the right and left test track boundaries.

11. The system of claim 10, wherein the computing device further includes:

a processor programmed for deriving erase-right and erase-left line equations representing best-fit lines through those erase-right and erase-left data values within a specified range of the maximum signal strength, and for computing the right and left test track boundaries from the erase-right and erase-left line equations by applying a value equivalent to a specified percentage of the maximum signal strength to the erase-right and erase-left line equations.

12. The system of claim 11, wherein the specified range is centered at approximately 50% of the maximum signal strength.

13. The system of claim 11, wherein the specified percentage is approximately 50%.

14. The system of claim 10, wherein the signal strength measurement device further includes a detector for measuring remaining signal strength as a peak-to-peak voltage amplitude of the test signal information.

15. The system of claim 10, wherein the signal strength measurement device further includes a frequency analysis device for measuring remaining signal strength by generating a Fourier spectrum from the test signal information, the Fourier spectrum including a fundamental frequency, and measuring an amplitude of the fundamental frequency.

16. The system of claim 11, wherein the processor is programmed for deriving the erase-right line and erase-left equations using linear regression techniques.

17. The system of claim 11, wherein the processor is programmed for deriving the erase-right and erase-left line equations using curve-fit algorithms.

* * * * *